United States Patent
Weichart et al.

(10) Patent No.: US 10,784,092 B2
(45) Date of Patent: Sep. 22, 2020

(54) REACTIVE SPUTTERING WITH HIPIMS

(75) Inventors: Juergen Weichart, Balzers (LI);
Stanislav Kadlec, Prague (CZ);
Mohamed Elghazzali, Feldkirch (AT)

(73) Assignee: EVATEC AG, Trubbach (CH)

( * ) Notice: Subject to any disclaimer, the term of this patent is extended or adjusted under 35 U.S.C. 154(b) by 1451 days.

(21) Appl. No.: 12/329,064

(22) Filed: Dec. 5, 2008

(65) Prior Publication Data
US 2009/0173622 A1   Jul. 9, 2009

Related U.S. Application Data

(60) Provisional application No. 61/012,103, filed on Dec. 7, 2007.

(51) Int. Cl.
*C23C 14/34* (2006.01)
*H01J 37/34* (2006.01)
*C23C 14/00* (2006.01)
*C23C 14/04* (2006.01)

(52) U.S. Cl.
CPC ...... *H01J 37/3408* (2013.01); *C23C 14/0036* (2013.01); *C23C 14/0094* (2013.01); *C23C 14/046* (2013.01); *H01J 37/3405* (2013.01); *H01J 37/3467* (2013.01)

(58) Field of Classification Search
CPC .................. C23C 14/0094; C23C 14/0036
USPC ............ 204/192.13, 192.15, 192.16, 298.03, 204/298.02
See application file for complete search history.

(56) References Cited

U.S. PATENT DOCUMENTS

| | | | |
|---|---|---|---|
| 5,324,398 A * | 6/1994 | Erickson et al. | 205/701 |
| 5,503,725 A * | 4/1996 | Sablev et al. | 204/192.12 |
| 5,942,089 A | 8/1999 | Sproul et al. | |
| 6,147,404 A * | 11/2000 | Pramanick et al. | 257/751 |
| 6,303,958 B1 * | 10/2001 | Kanaya et al. | 257/310 |

(Continued)

FOREIGN PATENT DOCUMENTS

| | | |
|---|---|---|
| WO | 2005010228 A2 | 2/2005 |
| WO | 2007147582 A1 | 12/2007 |
| WO | WO 2007147582 A1 * | 12/2007 |

OTHER PUBLICATIONS

International Search Report for PCT/EP2008/066898 dated Mar. 4, 2009.

(Continued)

*Primary Examiner* — Jason Berman
(74) *Attorney, Agent, or Firm* — Pearne & Gordon LLP

(57) ABSTRACT

A method and apparatus for sputter depositing an insulation layer onto a surface of a cavity formed in a substrate and having a high aspect ratio is provided. A target formed at least in part from a material to be included in the insulation layer and the substrate are provided in a substantially enclosed chamber defined by a housing. A plasma is ignited within the substantially enclosed chamber and a magnetic field is provided adjacent to a surface of the target to at least partially contain the plasma adjacent to the surface of the target. A voltage is rapidly increased to repeatedly establish high-power electric pulses between a cathode and an anode. An average power of the electric pulses is at least 0.1 kW, and can optionally be much greater. An operational parameter of the sputter deposition is controlled to promote sputter depositing of the insulation layer in a transition mode between a metallic mode and a reactive mode.

18 Claims, 12 Drawing Sheets

(56) References Cited

U.S. PATENT DOCUMENTS

| | | | |
|---|---|---|---|
| 6,781,180 B1* | 8/2004 | Martin et al. | 257/301 |
| 2002/0046941 A1* | 4/2002 | Takigawa et al. | 204/192.38 |
| 2004/0182696 A1* | 9/2004 | Kuriyama et al. | 204/298.03 |
| 2005/0205413 A1 | 9/2005 | Ikari et al. | |
| 2006/0290002 A1 | 12/2006 | Arana et al. | |
| 2008/0102630 A1* | 5/2008 | Saito | 438/685 |
| 2010/0282598 A1* | 11/2010 | Ruske et al. | 204/192.13 |
| 2010/0326815 A1* | 12/2010 | Chistyakov | 204/192.12 |
| 2011/0220486 A1* | 9/2011 | Kohara et al. | 204/192.1 |
| 2011/0297167 A1* | 12/2011 | Reddy et al. | 131/280 |

OTHER PUBLICATIONS

Written Opinion for PCT/EP2008/066898 dated Mar. 4, 2009.
Sproul et al, "The Reactive Sputter Deposition of Aluminum Oxide Coatings Using High Power Pulsed Magnetron Sputtering (HPPMs)," Annual Technical Conference Proceedings Society of Vacuum Coaters, Albuquerque, NM, US. Apr. 24, 2004, pp. 96-100, XP002452058.
Sproul et al, "Multi-level Control for Reactive Sputtering," Annual Technical Conference Proceedings Society of Vacuum Coaters, Albuquerque, NM, US. Apr. 13, 2002, pp. 11-15, XP002972312.

\* cited by examiner

REACTIVE SPUTTERING WITH HIPIMS

CROSS-REFERENCE TO RELATED APPLICATIONS

This application claims the benefit of U.S. Provisional Application No. 61/012,103, filed Dec. 7, 2007, the entirety of which is incorporated herein by reference.

BACKGROUND OF THE INVENTION

1. Field of the Invention

This application relates generally to a reactive sputtering method and apparatus, and more specifically to a method and apparatus for establishing a suitable sputter rate and minimizing arcing experienced between a target and an anode or other portion of the apparatus.

2. Description of Related Art

Reactive magnetron sputtering is commonly used to produce nitride or oxide layers from metallic targets. Examples of applications where reactive magnetron sputtering can be employed include: the production of hard coatings for wear protection purposes; the production of optical coatings for filters and antireflection coatings; and the production of diffusion barriers and insulation layers in the electronics industry. However, such layers created according to conventional sputter deposition processes often include properties such as hardness, density, pinhole content that are not optimal for the particular application in which the layers are to be employed.

Pulsed sputtering processes have been proposed as one attempt to improve such properties of these layers. According to recent developments, pulsed plasma in very short pulses combined with very high power such as pulses having a low duty cycle of between 0.5 and 10% and power levels up to several Megawatts, for example, have resulted in high metal vapor ionization of more than 90%. Such a deposition process is commonly referred to as High Power Impulse Magnetron Sputtering ("HIPIMS") (also commonly referred to as High Power Pulsed Magnetron Sputtering, or "HPPMS"). Besides improved layer properties, HIPIMS also allows directional sputtering into 3-dimensional features due to the fact that the ionized metal can be accelerated by electric fields. This feature is of most commonly beneficial to semiconductor applications.

Semiconductor chips face constant development towards increased performance while still decreasing their size. Physical limitations imposed by these smaller chips limit power dissipation in the integrated circuit (IC) formed on a single layer, and the process technology for creating such chips is approaching a limit on the ability to form suitably small circuits. Thus, due to the potential processing problems in further increasing the lateral device density on single layers (e.g., wire bonding techniques), future ICs can be formed on a plurality of stacked substrates, creating stacked ICs instead of further increasing the lateral device density. This 3D integration can be applied to computer-readable memories, electro-optical applications, MEMS, sensors, above IC imagers, displays and other applications.

Stacked ICs include circuitry provided to a plurality of substrates that are vertically stacked on their planar surfaces. Through-Silicon Vias ("TSV") are formed in the stacked substrates to establish electrical connections between the circuitry provided to each of the stacked substrates. Current technologies form these TSVs by laser drilling or dry etching a trench or column, for example, in the substrate. The trench is then coated with an insulation layer prior to the subsequent metallization. After filling the trench or column with metal the substrates are ground so that the metal connect is exposed at the planar surface of the substrate opposite the planar surface that was at least partially removed to form the trench or column. The resulting TSV contacts exposed at one or both of the planar surfaces of substrate are then aligned with a corresponding contact provided to another of the plurality of substrates that will form the stacked IC to establish an electrical connection between the stacked substrates when coupled together. In order to provide suitably small contacts to maximize the usable area of the substrate for the IC, however, the TSVs desirably have aspect ratios of at least 10:1, or at least 20:1 to accommodate future devices.

Reactive sputtering methods have been employed for sputter depositing metals. During deposition of nitrides, however, the addition of nitrogen during sputtering of certain metals can lead to the formation of conductive layers like TiN or TaN, for example. The sputtering of pure metals (without or without insignificant amounts of reactive gases present) is often described as conducting sputter deposition in "metallic mode", as opposed to the so called "reactive mode", which includes reactive gases. The hysteresis, i.e. the difference in the deposition rate (and the target voltage) depending on whether a specific sputtering state is entered from the metallic mode or from the reactive mode under otherwise identical process properties, is typically small when adding nitrogen. The deposition of nonconductive oxides and non-conductive nitrides such as $Si_3N_4$, typically poses a greater challenge due to target and shield charging together with a pronounced hysteresis when adding oxygen or nitrogen. In the reactive mode with oxygen as the reactive gas the deposition rate for $SiO_2$ or $Al_2O_3$ is dramatically lower, typically more than a factor of 5 lower than when deposited in the metallic mode. A similar but less pronounced rate reduction is also seen in reactive mode deposition with nitrogen as the reactive gas, such as when depositing $Si_3N_4$ for example.

When applying current state of the art HIPIMS power supply to a reactive oxidizing process like $Al_2O_3$ from an Al target one will find very soon that for reasonable power levels considerable arcing can be observed. Arcing indicates the generation of short circuits between the cathode (target) and an anode or electric ground of a vacuum treatment system, caused by the build-up of insulating layers on parts of the vacuum system (the target itself, shields . . . ), which act as voltage dividers between the cathode and anode due to their dielectric nature (capacitor principle). In the reactive mode with a fully oxidized (poisoned) target the pulse length of the HIPIMS pulse in the range between 20 μsec. (i.e., $20 \times 10^{-6}$ sec.) and 200 μsec. (i.e., $200 \times 10^{-6}$ sec.) is too long to allow a discharging of the insulating target surface to occur. Sputtering in the fully reactive (poisoned or oxidized) mode with HIPIMS results in a low sputter rate.

Accordingly, there is a need in the art for a method and apparatus for applying an insulation layer to a TSV having a high aspect ratio. Such a method and apparatus can offer a high directionality to allow for a high-density insulation layer with minimal pinholes, and can facilitate sputter depositing a target material having a limited electrical conductivity with minimal arcing.

BRIEF SUMMARY

According to one aspect, the subject application involves a sputtering apparatus for sputter depositing an insulation layer onto a surface of a cavity formed in a substrate and having a high aspect ratio. The apparatus includes a housing defining a substantially enclosed chamber, and a pedestal to be exposed to an interior of said chamber for supporting the substrate at an appropriate position within said chamber during sputter depositing. A magnet assembly provides a magnetic field adjacent to a surface of a target formed at least in part from a material to be included in the insulation layer to be deposited onto the surfaces of the cavity. A power supply establishes high-power electric pulses with a rapid voltage increase in a plasma to be maintained within the magnetic field between a cathode and an anode, wherein an average power of the electric pulses is at least 0.1 kW. And a controller for controlling an operational parameter of the sputtering apparatus to conduct the sputter depositing of the insulation layer substantially in a transition mode between a metallic mode and a reactive mode.

According to another aspect, the subject application involves a method of sputter depositing an insulation layer onto a surface of a cavity formed in a substrate and having a high aspect ratio. The method includes providing a target formed at least in part from a material to be included in the insulation layer and the substrate in a substantially enclosed chamber defined by a housing, and igniting a plasma within the substantially enclosed chamber. A magnetic field is to be provided adjacent to a surface of the target to at least partially contain the plasma adjacent to the surface of the target. A leading edge of a voltage pulse waveform is to be rapidly increased to repeatedly establish high-power electric pulses between a cathode and an anode. An average power of the electric pulses is at least 0.1 kW;

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

The invention may take physical form in certain parts and arrangement of parts, embodiments of which will be described in detail in this specification and illustrated in the accompanying drawings which form a part hereof and wherein.

DETAILED DESCRIPTION

Figure 1:
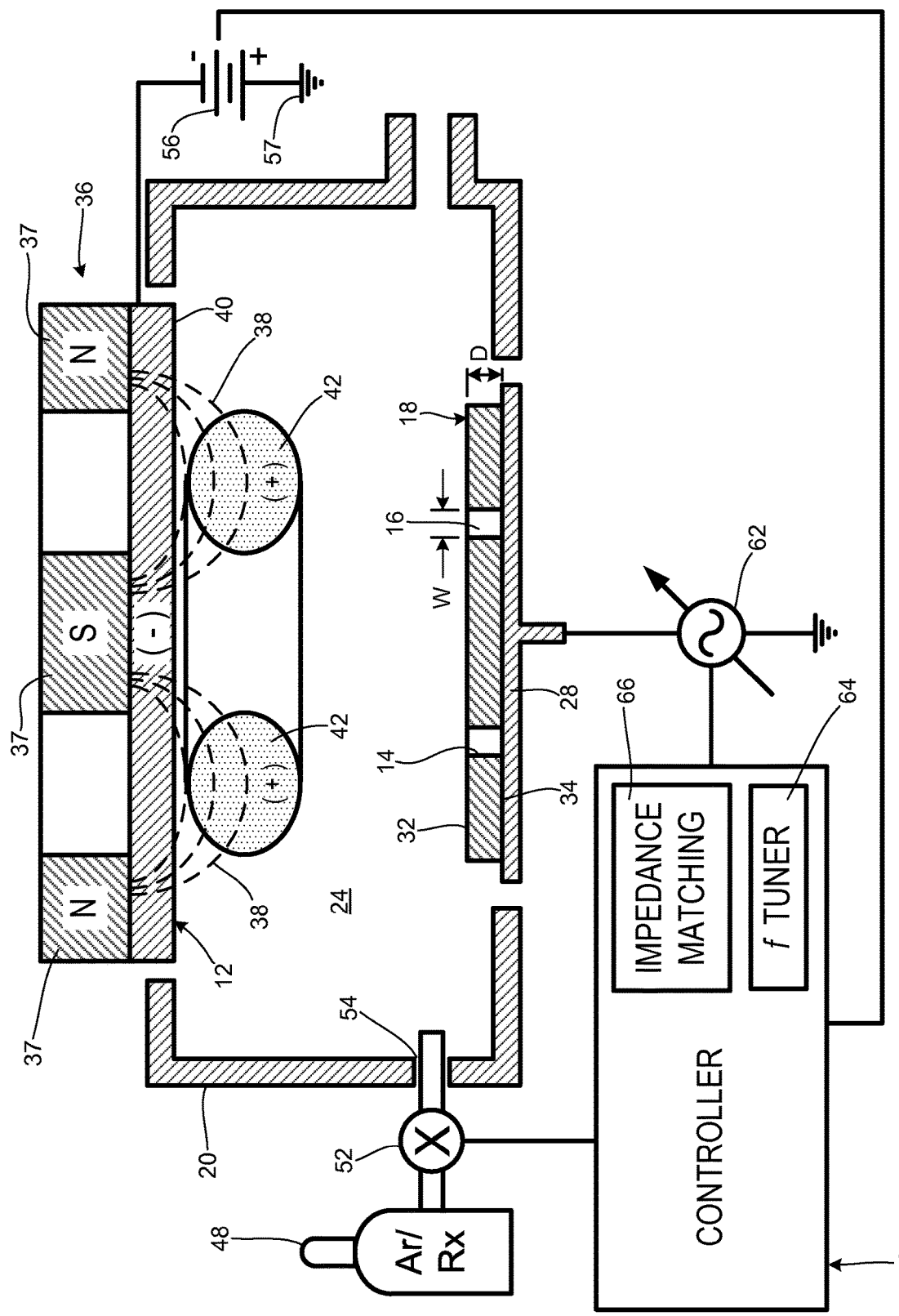
FIG. 1 shows an illustrative embodiment of a HIPIMS sputtering apparatus for sputter depositing an electrically-conductive material onto substantially-vertical side walls of a trench, wherein a portion of the sputter reactor has been cut away.

Certain terminology is used herein for convenience only and is not to be taken as a limitation on the present invention. Relative language used herein is best understood with reference to the drawings, in which like numerals are used to identify like or similar items. Further, in the drawings, certain features may be shown in somewhat schematic form.

It is also to be noted that the phrase "at least one of", if used herein, followed by a plurality of members herein means one of the members, or a combination of more than one of the members. For example, the phrase "at least one of a first widget and a second widget" means in the present application: the first widget, the second widget, or the first widget and the second widget. Likewise, "at least one of a first widget, a second widget and a third widget" means in the present application: the first widget, the second widget, the third widget, the first widget and the second widget, the first widget and the third widget, the second widget and the third widget, or the first widget and the second widget and the third widget.

Figure 9:
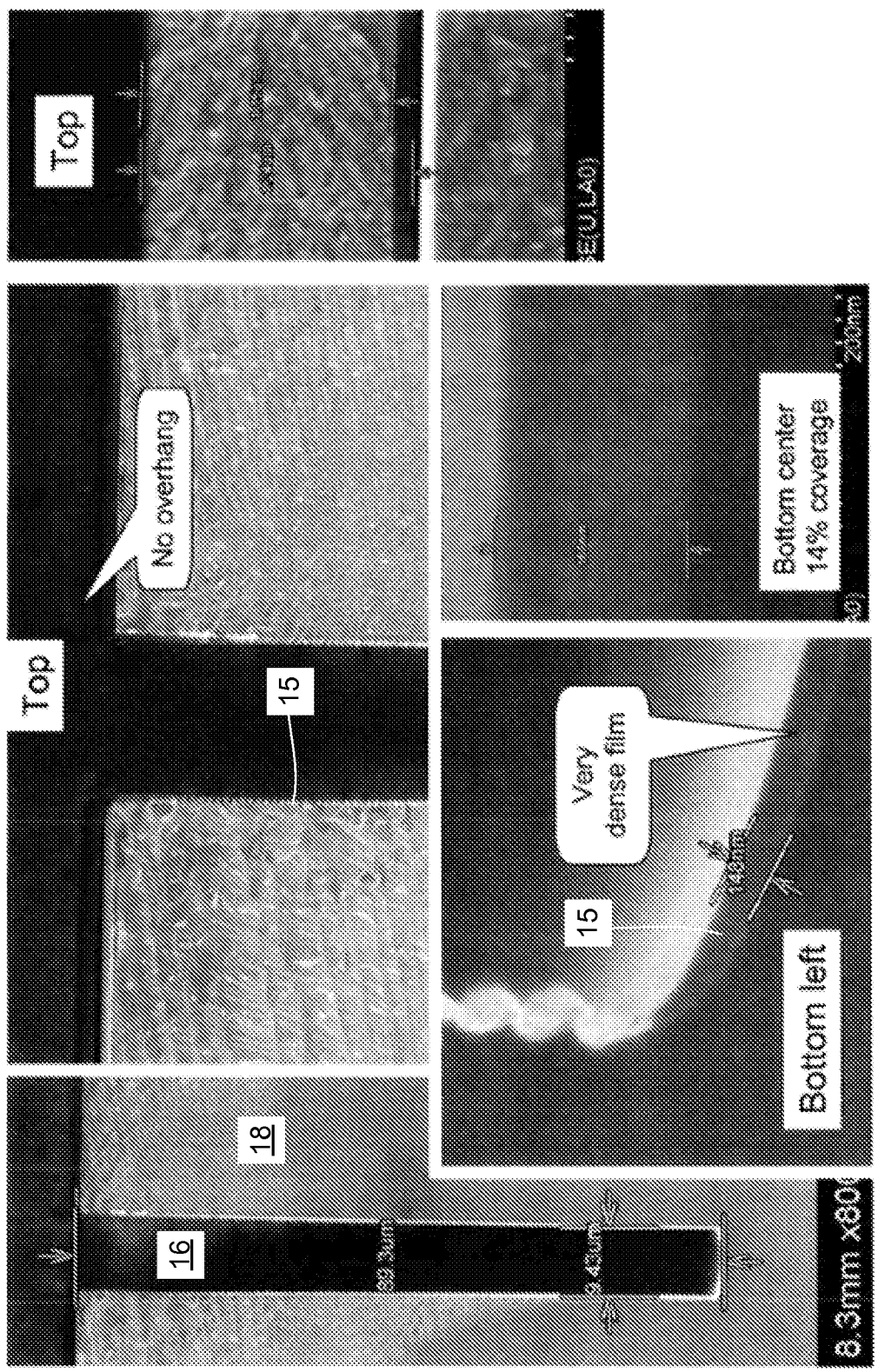
FIG. 9 shows SEM photographs of a trench formed in a substrate and an insulation layer deposited according to an aspect of the present invention.

The subject application relates to a High Power Impulse Magnetron Sputtering ("HIPIMS") sputtering apparatus 10 and a method for magnetically-enhanced sputtering an electrically-conductive material from a target 12, reacting the material from the target 12 with a reactive gas to form an insulating material, and depositing the insulating material on substantially vertical side walls 14 of a trench 16 formed in a semiconductor substrate 18 to form an insulation layer 15 (FIG. 9). An illustrative arrangement of such a sputtering apparatus 10 is shown in FIG. 1, and includes a reactor housing 20 defining a substantially enclosed chamber 24 in which HIPIMS sputter deposition of the insulation layer 15 onto the semiconductor substrate 18 is to take place. Although described herein as depositing an insulation layer 15 on a surface of trench formed in a semiconductor substrate 18, the present technology can be employed to deposit an insulation layer 15 on any surface of any type of substrate. The surface can optionally include substantially vertical side walls of a trench or other type of cavity formed in the substrate. Further, the substrate can be made of any suitable material for a particular application. To clearly describe the present invention, and for the sake of brevity, however, deposition of an insulating layer onto side-wall surfaces of a trench during formation of a TSV before metal filling the TSV will be described in detail below.

A pedestal 28 fabricated from an electrically-conductive material such as a metal or metal alloy, for example, is exposed to, and optionally extends at least partially into the chamber 24 to support the semiconductor substrate 18 at an appropriate position within the chamber for sputter deposition operations. The semiconductor substrate 18 shown resting on the pedestal 28 in FIG. 1 is a substantially planar wafer, having a top planar surface 32 and a bottom planar surface 34 that rests on the pedestal within the chamber. The one or more trench(es) 16 formed in the semiconductor substrate 18 can be open at the top planar surface 32 and closed by the bottom planar surface 34 to form a trench 16 having a generally U-shaped cross section as shown in FIG. 1, that extends at least partially into the semiconductor substrate 18 along a depth D dimension. The side walls of the trench 16 define the interior periphery of the trench 16 between the top planar surface 32 and the bottom planar surface 34 of the semiconductor substrate 18. Each side wall can extend to a suitable depth D into the semiconductor substrate 18 relative to a width W of the trench to give the trench what is commonly referred to as an aspect ratio of at least 10:1. Other embodiments of the trench can optionally have an aspect ratio of at least 20:1. Aspect ratios are expressed herein as a ratio of the depth of the trench to the width of the trench 16.

A magnet assembly 36 including a plurality of permanent magnets 37 or other suitable magnetic field generator is positioned to generate a magnetic field 38 adjacent to an exposed surface 40 of the target, which is formed at least in part from an electrically-conductive material that is to react with a reactive gas as described below to form the insulation material that will form the insulation layer 15 to be deposited onto the interior surfaces of the trench 16. The magnetic field 38 generated by the magnet assembly 36 confines plasma 42 near, or optionally on the exposed surface 40 of the target 12 in what is referred to as a confinement region. Further, the magnetic field 38 also acts as an electron trap, altering the unbiased trajectories of secondary electrons ejected from the target 12 to maximize the likelihood that the an inert sputtering gas within the confinement region will be ionized.

The inert sputtering gas, which is typically an inert gas such as argon for example, is supplied from a gas supply 48 and metered into the chamber through a mass flow controller 52, which is operatively connected to a controller 58. The sputtering gas flows through an inlet port 54 formed in the housing. The pressure in the chamber is maintained by a vacuum pump system (not shown) operatively connected in fluid communication with the chamber. Although the chamber has a standard pressure of about $10^{-8}$ Torr, typical sputtering operations not involving complete sustained self-sputtering, the chamber pressure can be maintained within a range from about 0.1 milliTorr to about 5 milliTorr, including any subranges therein.

In addition to the inert sputtering gas, a reactive gas that can react with the atoms ejected from the target 12 is fed into the chamber 24 from a reactive gas tank provided to the gas supply 48. Examples of suitable reactive gases include oxygen and nitrogen for example, although any other suitable reactive gases are considered to be within the scope of the present technology. According to one embodiment, the target can eject aluminum atoms, and the insulating material that results from the reaction between the aluminum atoms and the reactive gas is $Al_2O_3$, which can be deposited as the insulation layer 15. Examples of other suitable insulating materials include, but are not limited to, $Si_3N_4$ and $SiO_2$.

The plasma 42 is initiated by flowing the argon or other sputtering gas into the chamber and igniting it into a plasma by selectively establishing a DC voltage with a DC power supply 56 electrically connected to the target 12 across a grounded anode 57 and a negatively-biased cathode, said cathode including the target 12 according to the present embodiment. Although a higher DC voltage is needed for initiation, a target DC voltage within a range from about −400 to −700 VDC, such as −500 VDC, −600 VDC, or any other suitable voltage in the range from about −350 VDC to about −5 kVDC, including all voltages within that range, can maintain the existence of the plasma 42 within the confinement region. Even after the DC voltage from the DC power supply 56 is terminated, charged particles remain in the chamber 24 and contribute to a decaying DC voltage for several tens of microseconds, resulting in an afterglow effect following termination of the DC voltage from the DC power supply 56. The controller 58 is also operatively coupled to the DC power supply 56 to control the output of that DC power supply 56 as described herein. Once the plasma 42 has been initiated, the supply of argon or other sputtering gas may also be reduced from the flow rate that existed at a time when the plasma 42 was initiated, or optionally discontinued altogether under direction from the controller 58. Activation and termination of the DC power supply to discharge the high-power, low duty cycle electric pulses during HIPIMS sputter deposition of the insulation layer 15 can also be controlled by the controller 58.

For example, the controller 58 can optionally repeatedly and rapidly raise the DC voltage applied by the DC power supply 56 at the leading edge of each pulse to provide the electric pulses with an average power of at least 0.1 kW. Typically, the electric pulses according to HIPIMS sputter deposition will have an average power within the range from about 1 kW to about 5 kW, but can include any high average power from about 0.1 kW up to about 7 kW. A peak pulse power of about 30 kW to about 300 kW, is typical, and higher peak powers are possible, including a peak power of about 1 MW can be produced by each electric pulse.

At such power levels, high power densities on the order of 1 or more $kWcm^{-2}$ can be applied in electric pulses having a short duration that can be at least 10 μsec., but more typically will be about 40 μsec. to about 200 μsec. The duty cycle (ratio of time on/time off) will be low, such as less than or equal to about 10%, but can also be any duty cycle from about 2% to about 10%.

A variable RF power source 62, or other suitably alternating power source, is electrically connected to the pedestal 28 to apply a high-frequency signal to the pedestal and generate a self-bias field adjacent to the semiconductor substrate 18 supported on the pedestal 28 during HIPIMS sputtering operations. The self-bias field is effective to accelerate ions of the material ejected from the target 12 in the direction perpendicular to the semiconductor substrate 18, thus promoting deposition of the resulting insulating material along the lower portions of the trench's side walls and a bottom of the trench 12, despite having high aspect ratios of at least 10:1, and according to alternate embodiments, at least 20:1. The self-bias voltage can be selectively controlled by varying the power of the high-frequency signal generated by the variable RF power supply 62 and delivered to the pedestal 28. For the illustrative embodiments discussed herein, the power of the high-frequency signal can be adjusted to any value within a range from about 300 Watts to about 3,000 Watts, including any subranges and values therein.

Similar to the DC power supply 56 and flow controller 52, the variable RF power supply 62 can be controlled by the controller 58 to meet the needs of the desired HIPIMS sputtering process being carried out. For the embodiment shown in FIG. 1, the controller includes a frequency tuner 64 for adjusting a frequency of the high-frequency signal from the variable RF power supply 62 to any frequency within a range from about 1 MHz to about 70 MHz, including any subranges and values therein, according to illustrative embodiments, and within a range from about 1 MHz to about 50 MHz, including any subranges and values therein, for other illustrative embodiments. According to yet other illustrative embodiments, the target frequency can be adjusted to about 13.56 MHz, and for any of the target frequencies, the frequency tuner 64 can adjust the frequency of the high-frequency signal within a suitable tolerance for the particular HIPIMS sputtering application. For example, the frequency tuner 64 can adjust the frequency of the high-frequency signal to within ±5%, or within any other suitable tolerance, of the target frequency. For the sake of brevity and clarity, however, the sputtering processes will be described below using a high-frequency signal within ±5% of a target frequency of about 13.56 MHz.

In addition to the frequency, the controller 58 can also control the duration of, or the duty cycle of the high-frequency signal applied to the pedestal 28. For example, the controller 58 can adjust the duty cycle of the high-frequency signal to a value that is larger, but optionally not significantly larger than the duty cycle of pulses of DC voltage from the DC power supply. According to other embodiments, the controller 58 can optionally maintain the supply of the high-frequency signal to the pedestal 28 at least as long as a corresponding electric pulse of DC voltage is being supplied to the target 12, and optionally discontinue, or at least reduce the power of the high-frequency signal applied to the pedestal 28 only after termination of the DC voltage across the target 12 and anode by the DC power supply as described in further detail below.

Figure 2:
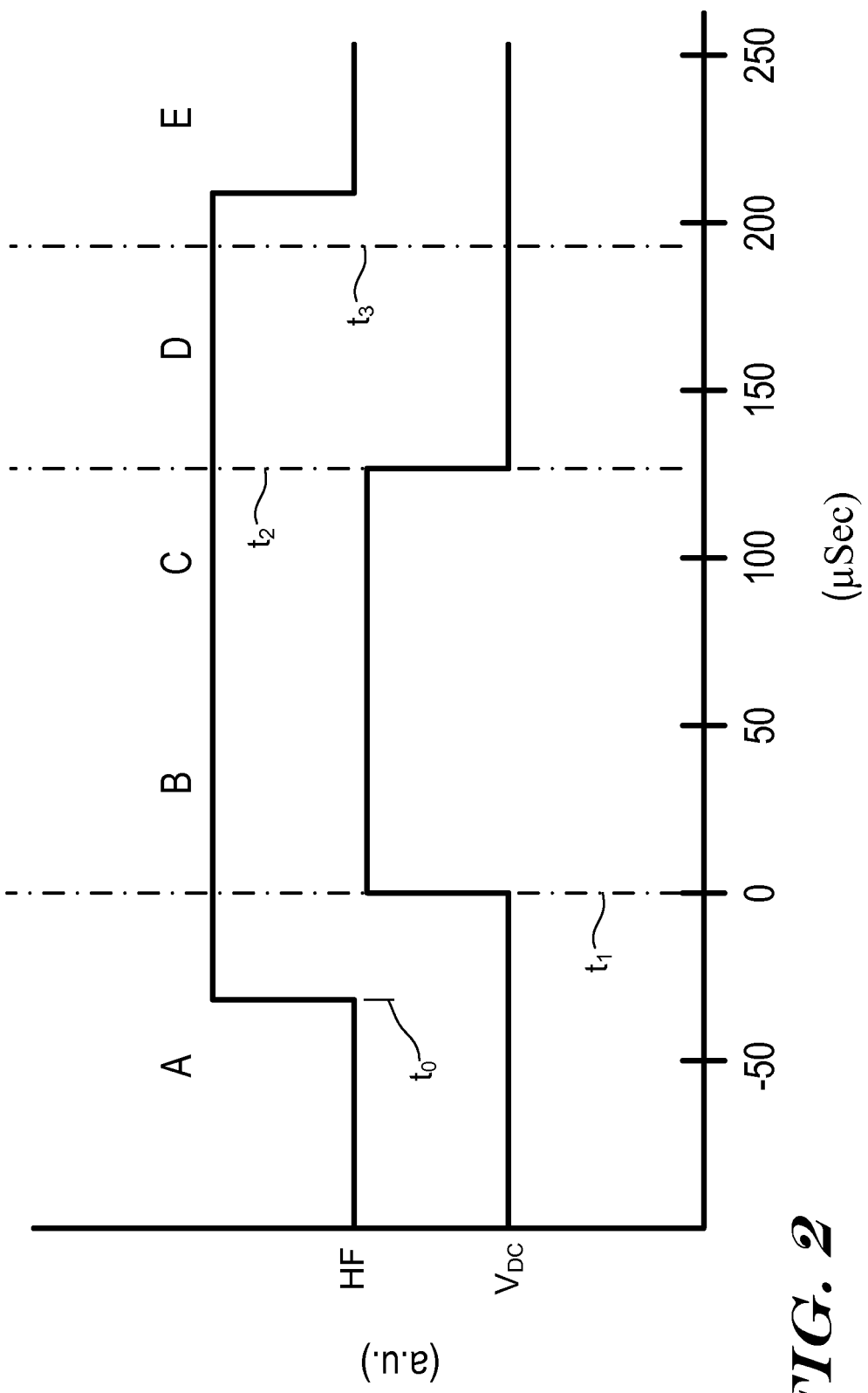
FIG. 2 is a timing diagram illustrating an embodiment of establishing a high-frequency signal synchronized with a HIPIMS pulse.

According to yet other embodiments, the controller 58 can initiate transmission of the high-frequency signal to the pedestal 28 prior to initiation of an electric pulse of DC voltage from the DC power supply, maintain transmission of the high-frequency signal to the pedestal for the duration of, and optionally beyond termination of, the electric pulse of DC voltage from the DC power supply 56, and discontinue transmission of the high-frequency signal to the pedestal 28 after termination of the electric pulse of DC voltage from the DC power supply 56. Such an embodiment is illustrated in the timing diagram of FIG. 2, wherein the on/of of the high-frequency signal is denoted by line HF and the on/off of the electric pulse is denoted as line $V_{DC}$. Thus, the high-frequency signal is said to envelop, or be synchronized with the electric pulse from the DC power supply 56.

An impedance matching network 66 (FIG. 1) is operatively connected to, and optionally integrated within the controller 58. The impedance matching network 66 adjusts the output impedance of the variable RF power supply 62 to approximately match the input impedance of the load to which the variable RF power supply 62 is supplying the high-frequency signal. Matching the impedances in such a manner maximizes the power transfer and minimizes reflected power from the load seen by the RF power supply 62. The impedance matching network 66 can optionally be variable or fixed, and is operable to establish a maximum voltage of the self-bias field at approximately the same time as a maximum DC current from the DC power supply during an electric pulse occurs.

Figure 3:
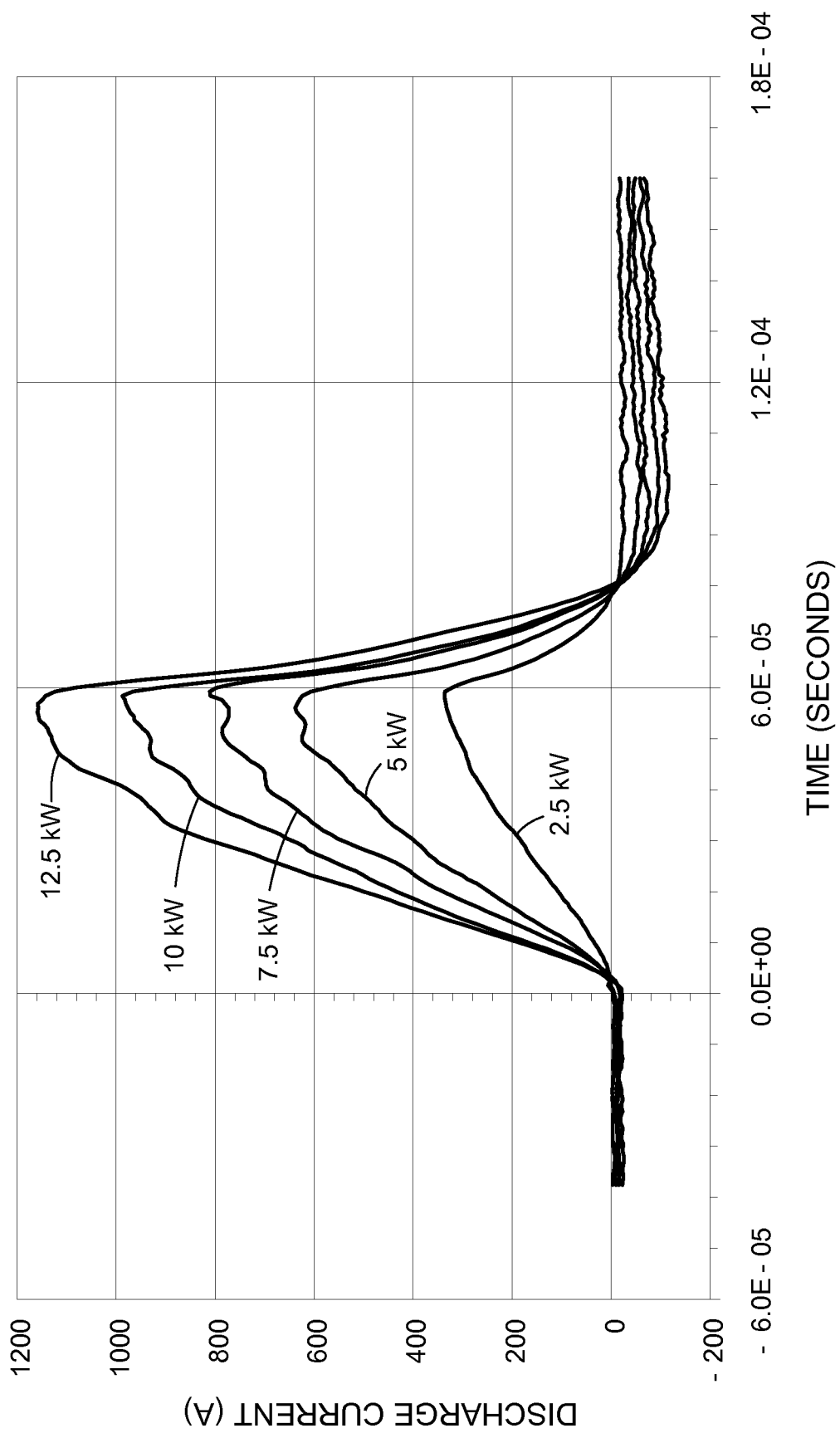
FIG. 3 shows illustrative examples of the DC current for different DC pulse power levels during an electric pulse including a pulse that lasts about 60 microseconds.
Figure 4:
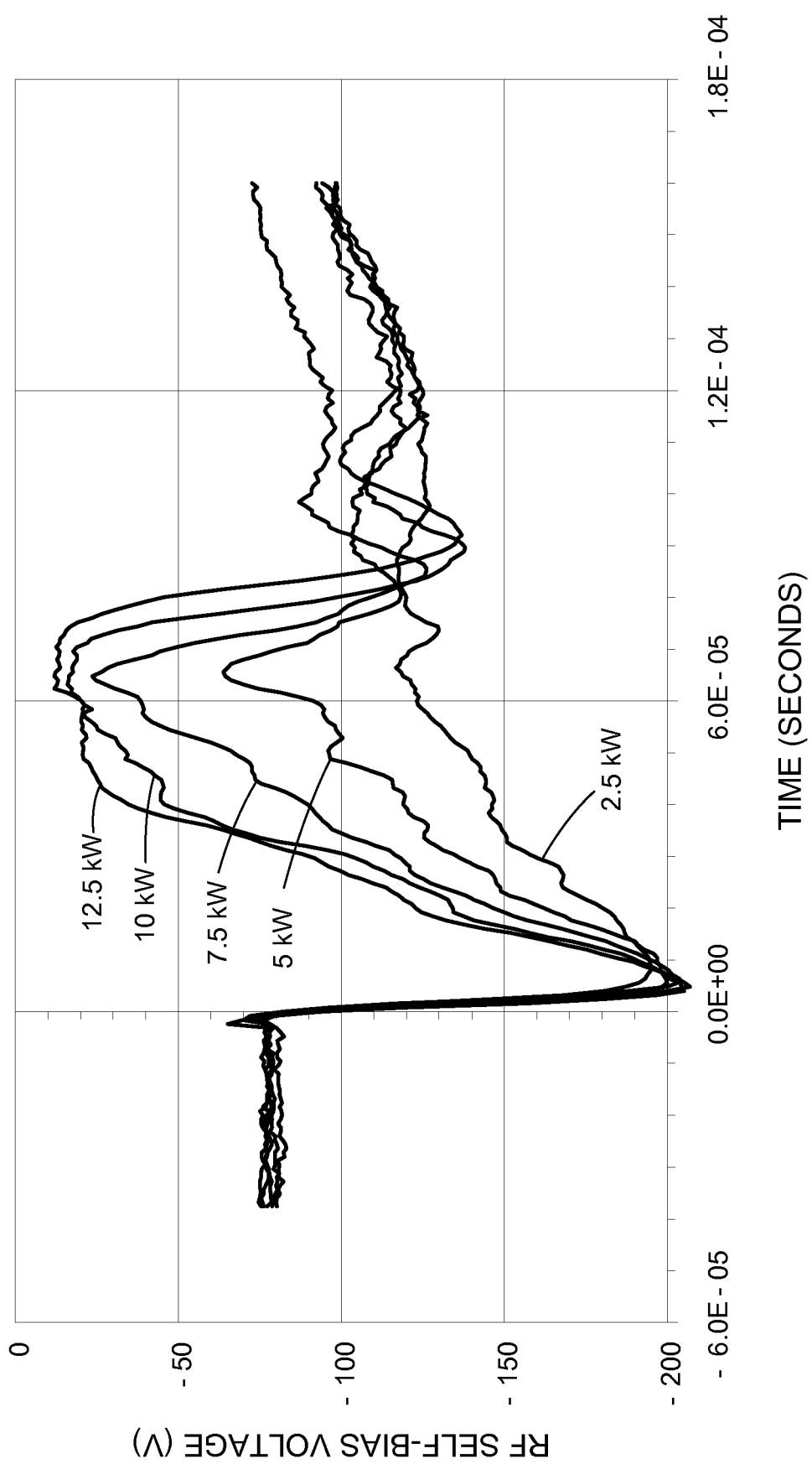
FIG. 4 shows a self-bias voltage waveform generated by a high-frequency signal being applied to a pedestal supporting a substrate on which the electrically-conductive material is being sputtered as a function of time, said high-frequency signal being applied to the pedestal during the HIPIMS pulse.

The approximately simultaneous occurrence of the maximum voltage of the self-bias field and the maximum DC current of the electric pulses from the power supply 56 can be seen from FIGS. 3 and 4. FIG. 3 shows illustrative examples of the DC current for different DC pulse power levels during a pulse cycle including a pulse that lasts about 60 microseconds. FIG. 4 shows illustrative examples of the corresponding reaction of the self bias voltage of the self bias field at the semiconductor substrate 18 generated by the variable RF power supply 62 for the same power levels. As can be seen in FIG. 3, the maximum DC current for the electric pulse at each separate power level trace occurs approximately 60 microseconds (i.e., 6.0E-05 along the abscissa) after application of the DC voltage for this particular pulse. Similarly, FIG. 4 reveals that a maximum self bias voltage for each power level trace also occurs at approximately 60 microseconds (within a reasonably close proximity thereof) following application of the DC voltage pulse across the anode 57 and target 12 during the subject pulse. Thus, the maximum DC current and maximum self bias voltage can occur substantially simultaneously for each pulse.

The HIPIMS sputter deposition described herein is performed substantially in what is referred to as a "transition mode" between a "metallic mode" and a "reactive mode." Sputter depositing pure metals in the absence of, or substantially without a reactive gas (or an excess amount of the reactive gas) present is often described as the "metallic mode" of a sputtering process. Almost all of the reactive gas, if present, introduced into the chamber 24 is consumed by a reaction with the sputtered particles from the target 12. In contrast, in the so called "reactive mode" sputter deposition occurs with a reactive gas present in an amount greater than a critical amount within the chamber 24. Upon reaching the critical amount of the reactive gas, a jump in the partial pressure of the reactive gas in the chamber 24 can be observed. HIPIMS sputter deposition according to the transition mode takes place at conditions between the metallic mode and the reactive mode.

Figure 5A:
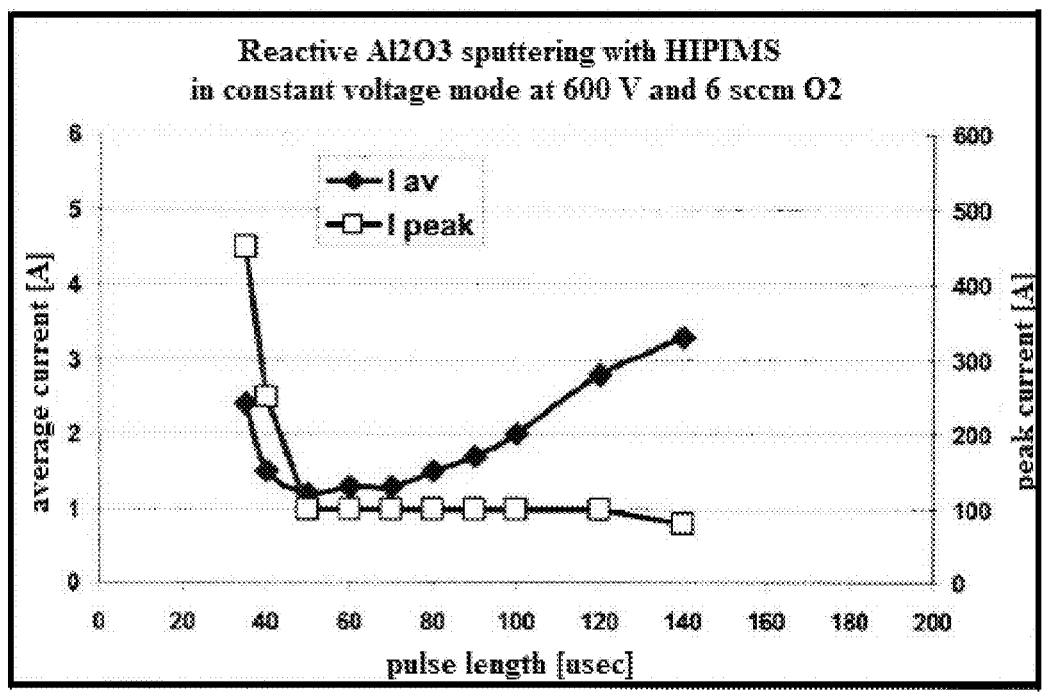
FIGS. 5A-5C show average and peak currents of electric pulses as a function of electric pulse duration during reactive sputtering with HIPIMS at a constant electric pulse voltage and constant reactive gas flow rate.

Changing from the metallic mode to the reactive mode, or vice versa, can also be accomplished by holding a flow rate of the reactive gas into the substantially enclosed chamber 24 and the voltage of the electric pulses for HIPIMS sputter deposition at a substantially constant value. Instead of altering the flow rate of the reactive gas into the chamber 24, the duration of the electric pulses from the DC power supply 56 can be adjusted. As shown in the example of FIG. 5A, the average discharge current and peak current of the electric pulses is plotted as a function of the duration of the electric pulses. With the voltage of the electric pulses fixed to about 600 V and a reactive gas ($O_2$ in the present example) flow rate of about 6 sccm, a pulse length of about 140 μsec. at produced an average current of between 3 A and 4 A. The relatively lengthy pulse duration caused a substantial portion of the reactive gas to react with particles ejected from the target, and therefore, such a pulse duration corresponds to the metallic mode.

As the duration of the electric pulses is shortened the average current falls until it reaches a local minimum of just over 1 A corresponding to a pulse length of about 50 μsec. Further shortening the duration of the electric pulses beyond the length of time corresponding to the local minimum results in a rapid jump in the average discharge current of the electric pulses generated by the DC power supply 56 indicating a transition to the reactive mode. The rapid jump in the average discharge current can be attributed to a higher secondary electron emission coefficient for oxidized aluminum relative to the secondary electron emission coefficient for metallic aluminum as the aluminum target material, for example, approaches full oxidation. HIPIMS sputter deposition in the transition mode occurs when the duration of the electric pulses lasts between the length of time of electric pulses corresponding to an average discharge current indicative of the metallic mode and the length of time of electric pulses corresponding to an average discharge current indicative of the reactive mode. More typical, the duration of the pulses corresponding to HIPIMS sputter deposition in the transition mode will be substantially similar to the duration of the electric pulses corresponding to the local minimum of the average discharge current between the metallic and reactive modes. For the example illustrated in FIG. 5b, the duration of the electric pulses to perform HIPIMS sputter deposition in the transition mode, indicated by the circle 77, was chosen to be slightly less than 50 μsec., but within a reasonable proximity to 50 μsec. Since the duration of the electric pulses were chosen to be slightly less than 50 μsec., the HIPIMS sputter deposition will be performed in the transition mode, but can optionally behave closer to the reactive mode than the metallic mode.

According to other embodiments, the controller 58 can optionally vary the frequency of the electric pulses instead of varying the duration of the electric pulses to perform the HIPIMS sputter deposition in the transition mode. With the duration of the pulses kept the same, the frequency can be varied by the frequency tuner 64 of the controller 58 to establish the desired average discharge current of the electric pulses to conduct deposition of the insulation layer 15 in the transition mode between the metallic and reactive modes.

According to some embodiments such as the preparation of a semiconductor substrate 18 for fabrication of sensitive electronic devices, the highly transient HIPIMS electric pulses can potentially cause damage to the semiconductor substrate 18. To minimize such damage, a dielectric layer can optionally be deposited onto the surfaces of the trench 16 (in a separate deposition chamber other than chamber 24) before HIPIMS sputter deposition of the insulation layer 15. The dielectric layer is to be of a sufficient thickness to protect the semiconductor substrate 18 from damage caused by radiation from the electric pulses during HIPIMS sputter deposition. The dielectric layer may be produced by conventional DC pulsed magnetron sputtering without HF bias, HF magnetron sputtering, PECVD, atomic layer deposition ("ALD"), or any other suitable deposition process. Thus, when the insulation layer 15 is deposited according to HIPIMS sputter deposition in the transition mode as described herein, it will be separated from the surfaces of the trench 16 by the dielectric layer.

Regardless of whether the dielectric layer is deposited before the HIPIMS sputter deposition of the insulation layer 15, the trench 12 with the insulation layer 15 can be coated or otherwise filled with an electrically-conductive material. As another optional step, to create a through-silicon via, for example, at least a portion of the bottom planar surface 34 of the semiconductor substrate 18 can be removed by grinding, polishing or other suitable process for example. Removing the portion of the bottom planar surface 34 of the semiconductor substrate 18 exposes the electrically-conductive material within the trench 16 to the newly-formed bottom planar surface 34 of the semiconductor substrate 18, enabling the semiconductor substrate 18 to be stacked with another semiconductor substrate. Electric communication between the substrates can be established by aligning the exposed contact at the bottom planar surface 34 of the semiconductor substrate 18 with the other semiconductor substrate, thus forming a stacked arrangement of semiconductor substrates on which an IC can be formed.

Experimental

Deposition runs according to an HIPIMS sputter deposition method and utilizing an apparatus as described above were performed. $Al_2O_3$ was sputtered reactively by HIPIMS on 200 mm silicon substrates 18 in a single substrate vacuum processing system such as an Oerlikon Cluster tool, produced by OC Oerlikon Balzers AG, for example, with a rotating magnet array provided under the target 12. The deposition parameters are shown below in Table 1.

For a set of constant electric pulse voltage and reactive gas ($O_2$) flow rate the HIPIMS electric pulse length is adjusted from a maximum of about 200 μsec., where due to a high electric pulse duty cycle of 10% at a frequency of 500 Hz, HIPIMS sputter deposition was performed in the metallic mode. The films deposited in this mode include a mixture of $Al_2O_3$ with high Al content, and have a brownish tint but are more or less transparent. From this starting point the HIPIMS electric pulse length is reduced incrementally and the average discharge current of the electric pulses recorded. When reducing the duty cycle the average discharge current decreases down to a local minimum. Beyond this minimum the current increases again indicating the transition to the reactive mode. The increasing current—and therefore deposited power—is due to higher secondary electron emission coefficient for oxidized Al against metallic Al. In this transition region transparent $Al_2O_3$ insulation layers and a high deposition rate—nearly like that experienced in the metallic mode—were experienced. Further decreasing the electric pulse duration causes the target to become substantially fully oxidized and the deposition rate is reduced dramatically. The plots appearing in FIGS. 5a-5c show the average current and the peak current for different sets of fixed $O_2$ flow and electric pulse voltage as function of the HIPIMS electric pulse length.

TABLE 1

| | |
|---|---|
| Target: | Aluminum ("Al") |
| Target Diameter: | 300 mm |
| Target Substrate Distance: | 70 mm |
| HIPIMS Pulse Repetition Frequency: | 500 Hz |
| HIPIMS Electric Pulse Length: | 400-200 |
| Duty Cycle: | μsec. |
| Pulse Peak Power: | about 30 kW to about 300 kW |
| Ar Flow Rate: | 100 sccm |
| O2 Flow Rate: | about 5 to about 20 sccm |
| Average Power: | 1-5 kW |

Figure 5B:
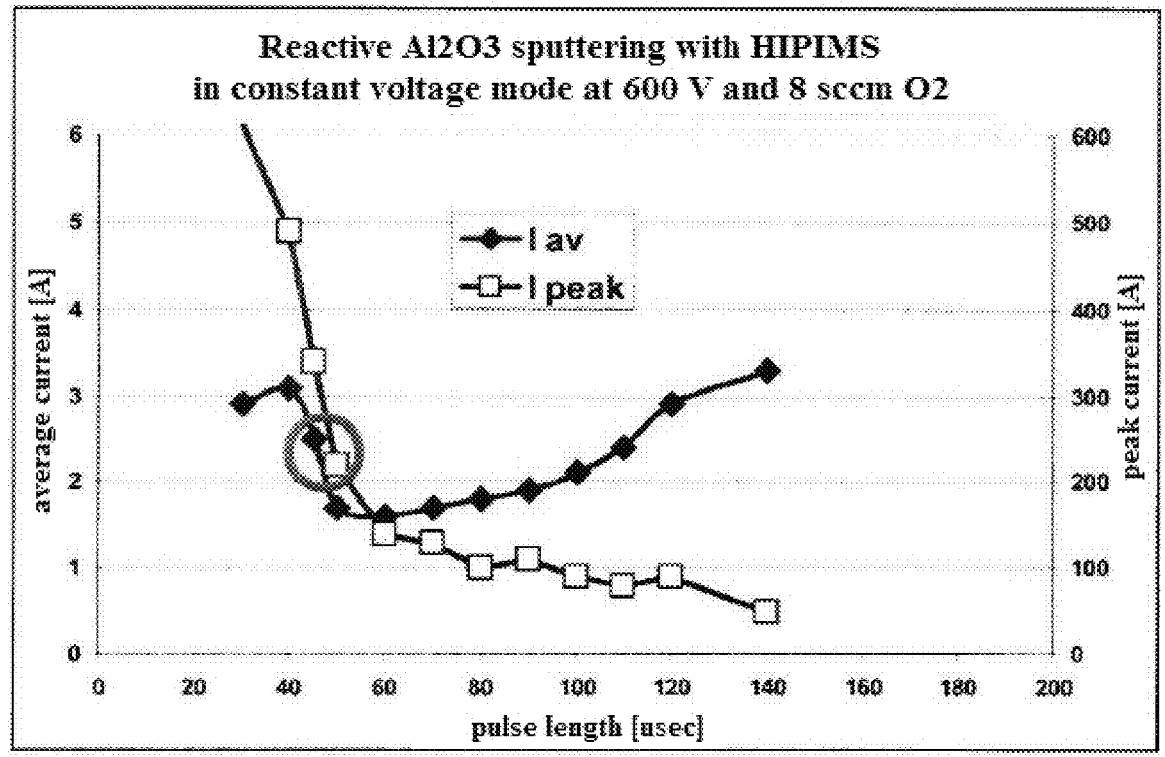
Figure 5C:
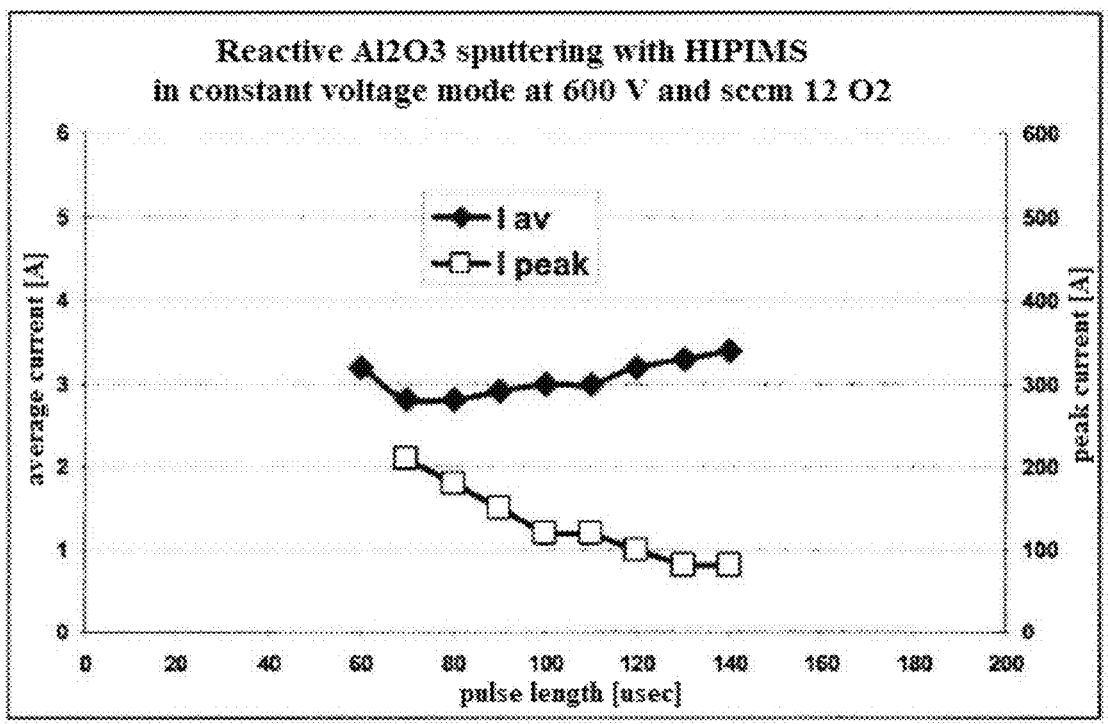

Initially, the DC power supply 56 was set to constant voltage mode to generate electric pulses of 600 V for the results shown in FIGS. 5a, 5b and 5c. FIG. 5a, discussed above, presents the results of varying the duration of the electric pulses from about 140 μsec. down to about 40 μsec. for a constant voltage of about 600 V and reactive gas ($O_2$) flow rate of about 6 sccm. The insulation layer 15 deposited was $Al_2O_3$. Likewise, FIG. 5b presents the results of varying the duration of the electric pulses from about 140 μsec. down to about 30 μsec. for a constant electric pulse voltage of about 600 V and a constant reactive gas ($O_2$) flow rate of about 8 sccm. The duration of the electric pulses for the transition mode chosen for the present experiment is identified by the circle 77. The resulting insulation layer 15 is substantially transparent when deposited in the transition mode. Similarly, FIG. 5c presents the results of varying the duration of the electric pulses from about 140 μsec. down to about 60 μsec. for a constant electric pulse voltage of about 600 V and a constant reactive gas ($O_2$) flow rate of about 12 sccm.

Figure 6A:
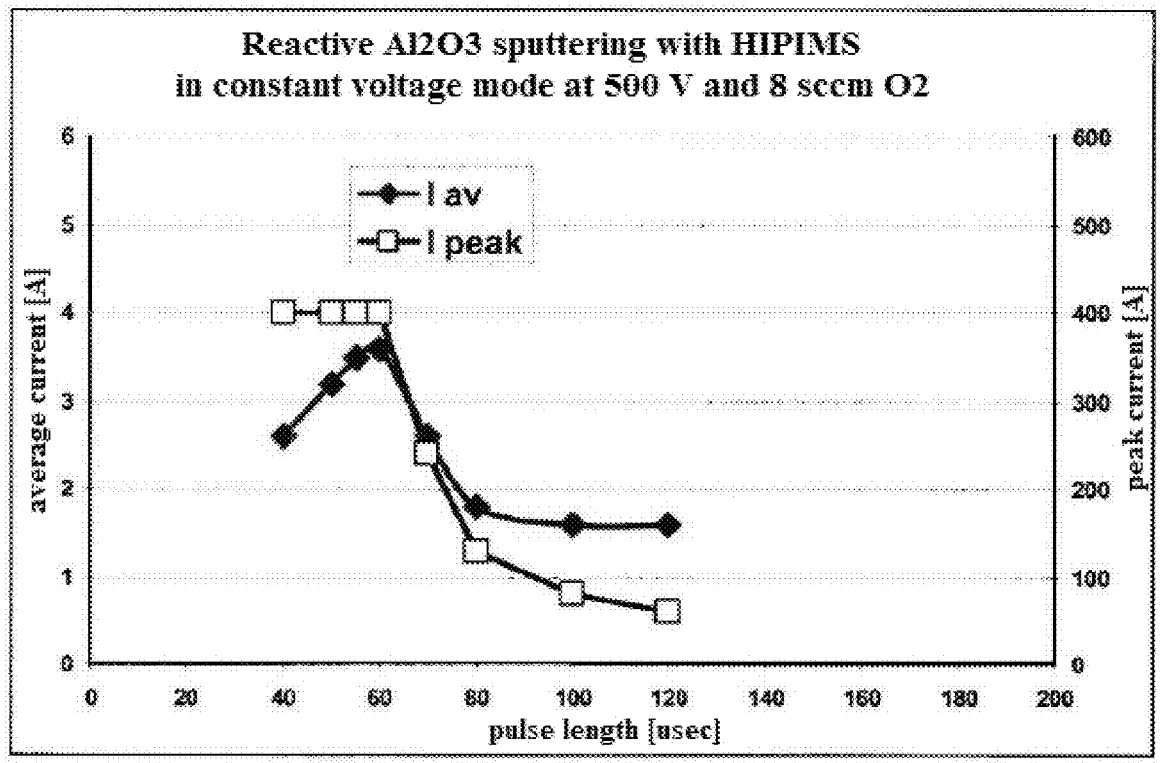
FIG. 6A-6C show average and peak currents of electric pulses as a function of electric pulse duration during reactive sputtering with HIPIMS at a constant electric pulse voltage for different reactive gas flow rates.
Figure 6B:
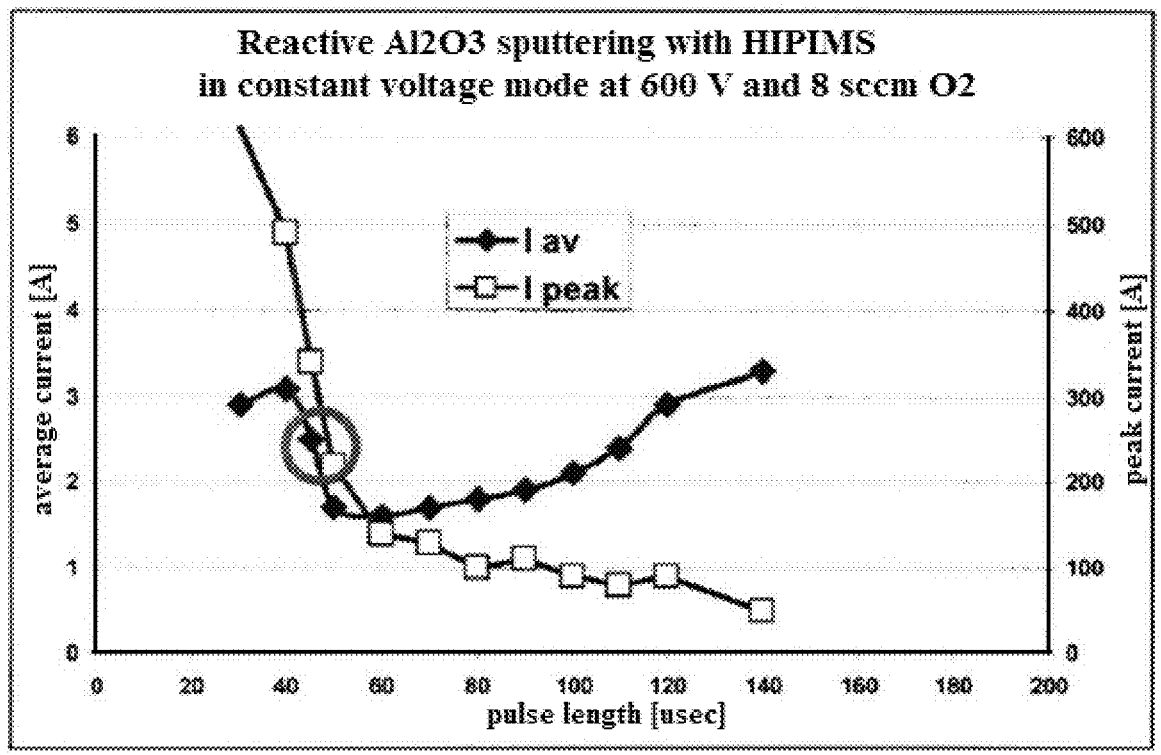
Figure 6C:
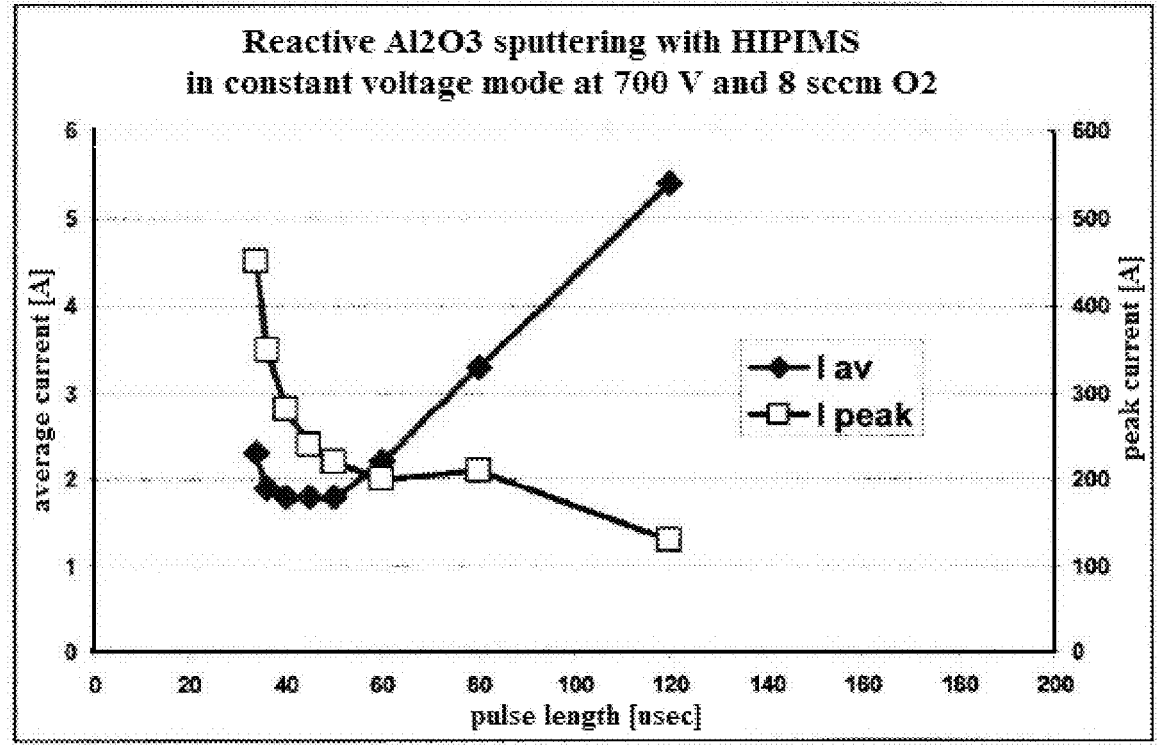

FIGS. 6A-6C show plots of the average and peak currents of the HIPIMS electric pulses for a fixed reactive gas ($O_2$) flow rate of about 8 sccm for different electric pulse voltages (500 V, 600 V, and 700 V, respectively) as a function of the HIPIMS electric pulse duration. Again, in FIG. 6B, includes a circle 77 identifying the pulse duration for a fixed electric pulse voltage of about 600 V and a fixed reactive gas flow rate of about 8 sccm. The insulation layer deposited with pulse durations falling within the circle 77 where substantially transparent $Al_2O_3$ deposited at high rate. Throughout these HIPIMS deposition runs, the specific deposition rates in Table 2 were observed. From these observations, it can be determined that, in the transition mode, the HIPIMS insulation deposition rate is therefore more than 8 times higher than in the reactive mode. The optical properties for the resulting $Al_2O_3$ deposited as the insulation layers in the transition mode as described herein were measured by spectroscopic ellipsometry, and are tabulated in Table 3 below.

TABLE 2

| | |
|---|---|
| $Al_2O_3$ Insulation Layer Deposition Rate in Metallic Mode: | 6-8 Å/kWs |
| $Al_2O_3$ Insulation Layer Deposition Rate in Reactive Mode: | 0.3-0.8 Å/kWs |
| $Al_2O_3$ Insulation Layer Deposition Rate in Transition Mode: | 2.5-4.2 Å/kWs |

TABLE 3

| | |
|---|---|
| Refractive Index (n): | 1.58-1.70 |
| Absorption (k): | 0.002-0.010 |

Figure 7:
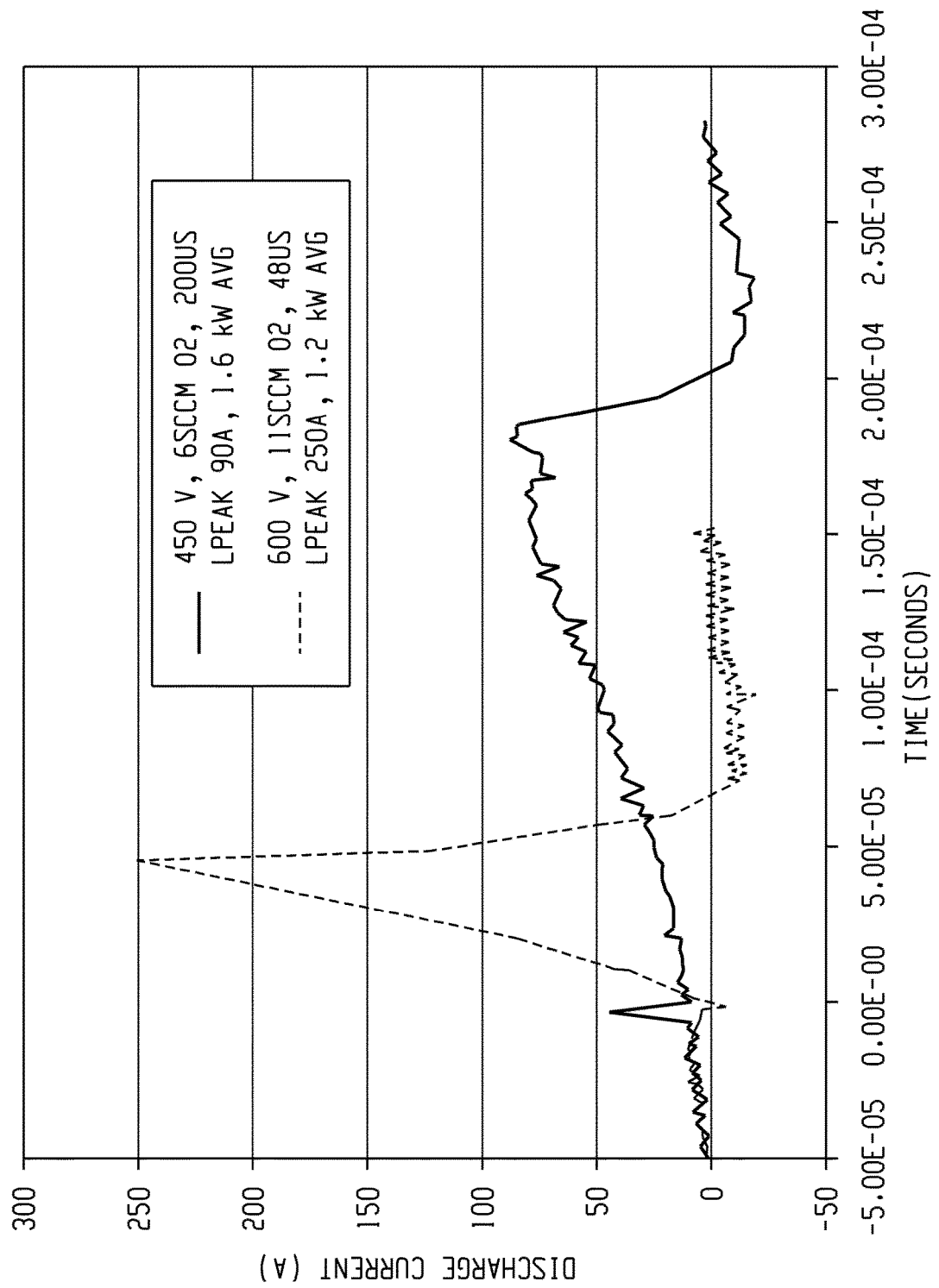
FIG. 7 shows a HIPIMS discharge current plot for transition mode sputtering substantially transparent $Al_2O_3$ insulation layers.

FIG. 7 shows oscilloscope traces of the development of a discharge current for a 45 μsec. electric pulse with a fixed voltage of 450 V and a reactive gas ($O_2$) flow rate of about 11 sccm, and for a 200 μsec. electric pulse with a fixed voltage of 200 V and a reactive gas ($O_2$) flow rate of about 6 sccm. The resulting $Al_2O_3$ insulation layers deposited were both substantially transparent. The properties of these insulation layers are tabulated in Table 4 below.

TABLE 4

| Pulse Length (μsec.) | Elec. Pulse Voltage (V) | Ave. Power (kW) | Sputter Gas (Ar) Flow Rate (sccm) | Reactive Gas ($O_2$) Flow Rate (sccm) | Refractive Index | Absorption | Insul. Layer Dep. Rate (Å/s) | Spec. Dep. Rate (Å/kWs) |
|---|---|---|---|---|---|---|---|---|
| 200 | 450 | 1.6 | 100 | 10.3 | 1.626 | 0.0021 | 6.6 | 4.1 |
| 48 | 600 | 1.2 | 100 | 6 | 1.700 | 0.0041 | 4.3 | 3.6 |

Figure 8:
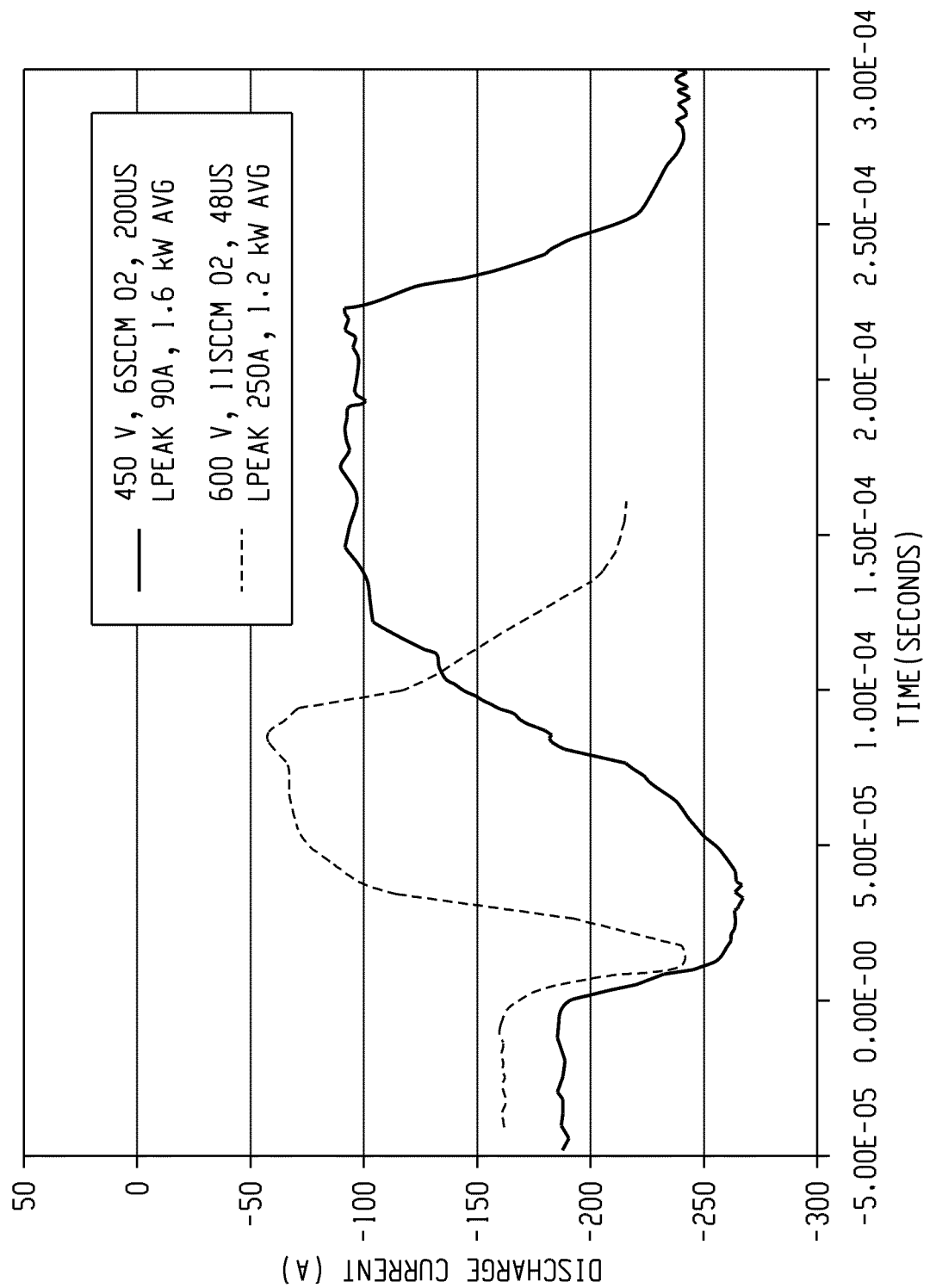
FIG. 8 shows Oscilloscope traces of the HIPIMS discharge current for different parameter sets.

In order to achieve a desired directional HIPIMS sputter deposition to deposit the insulation layer over a substantial portion of the surfaces of the trench, another deposition run was performed, including acceleration of the ions generated in the highly ionized HIPIMS discharge by a superimposed electric field generated with the high-frequency signal from the RF variable power supply. Due to the insulating nature of the growing film a high frequency (HF) bias was utilized. The HF signal was applied via a suitable impedance matching network that was able to sustain the accelerating voltage despite the increasing density. The discharge current was measured as a function of time and plotted in FIG. 8.

Figure 11:
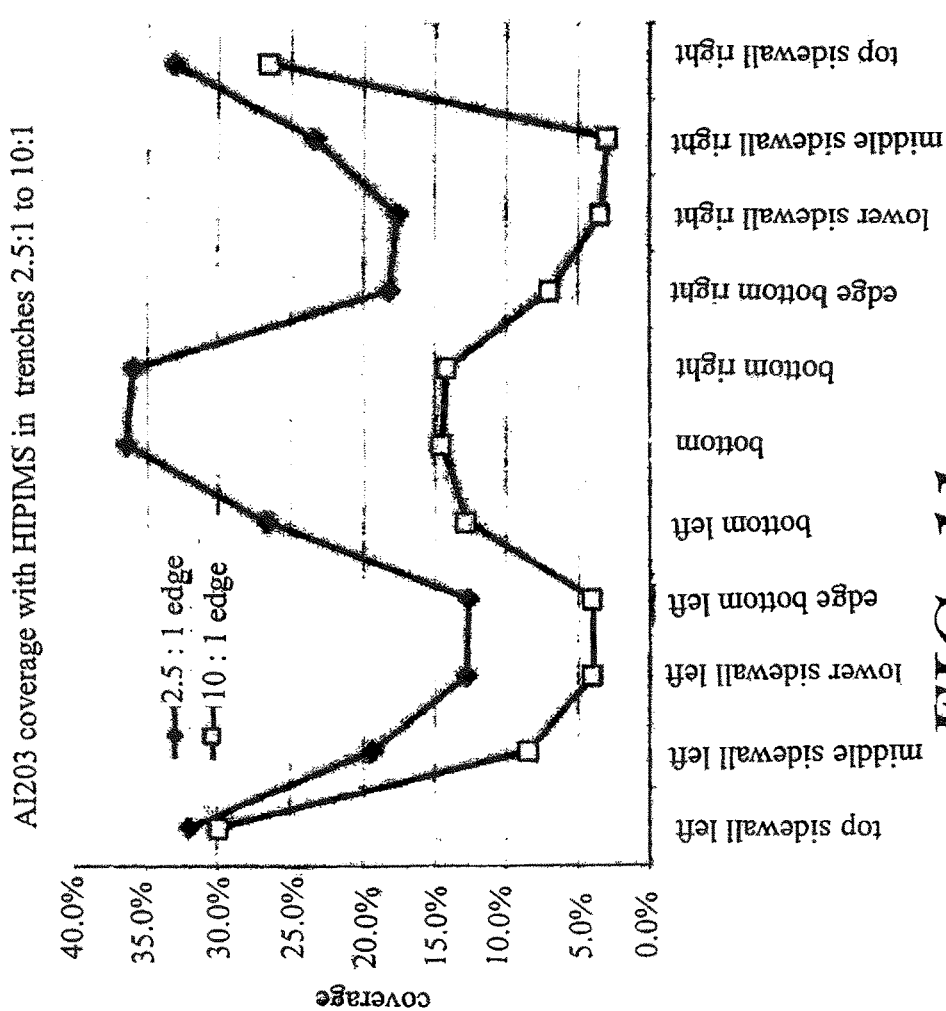
FIG. 11 shows a coverage profile of the surfaces identified in FIG. 10 with the insulation layer.
Figure 10:
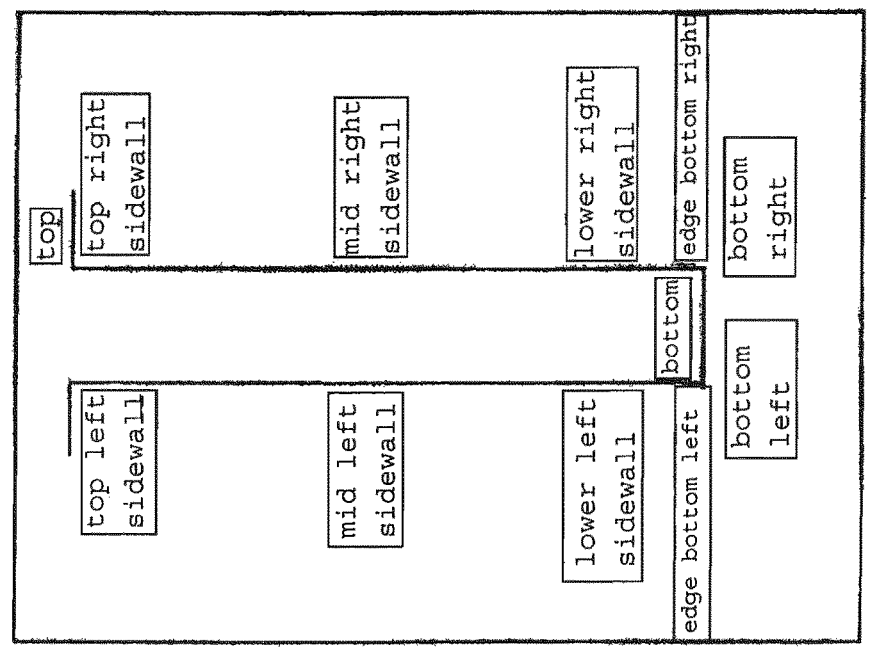
FIG. 10 is a schematic illustration of a trench, identifying various surfaces of the trench to be provided with an insulation layer according to an aspect of the present invention.
Figure 12:
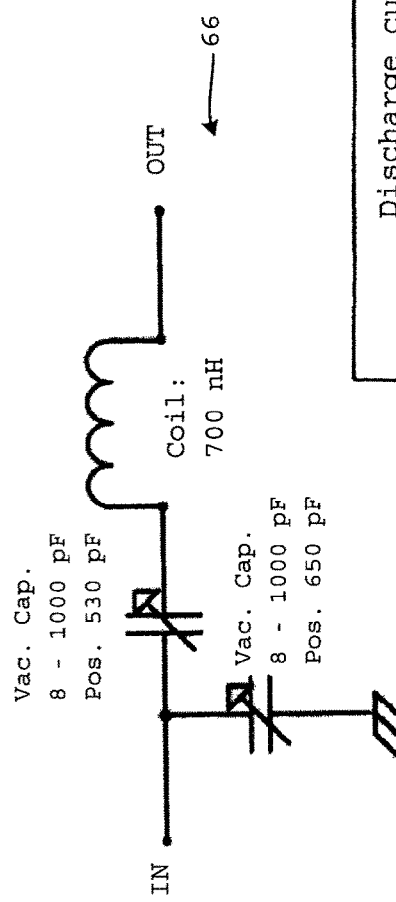
FIG. 12 shows an example of an impedance matching network for a RF power supply generating a high-frequency signal to biasing low impedance HIPIMS discharges.
Figure 13:
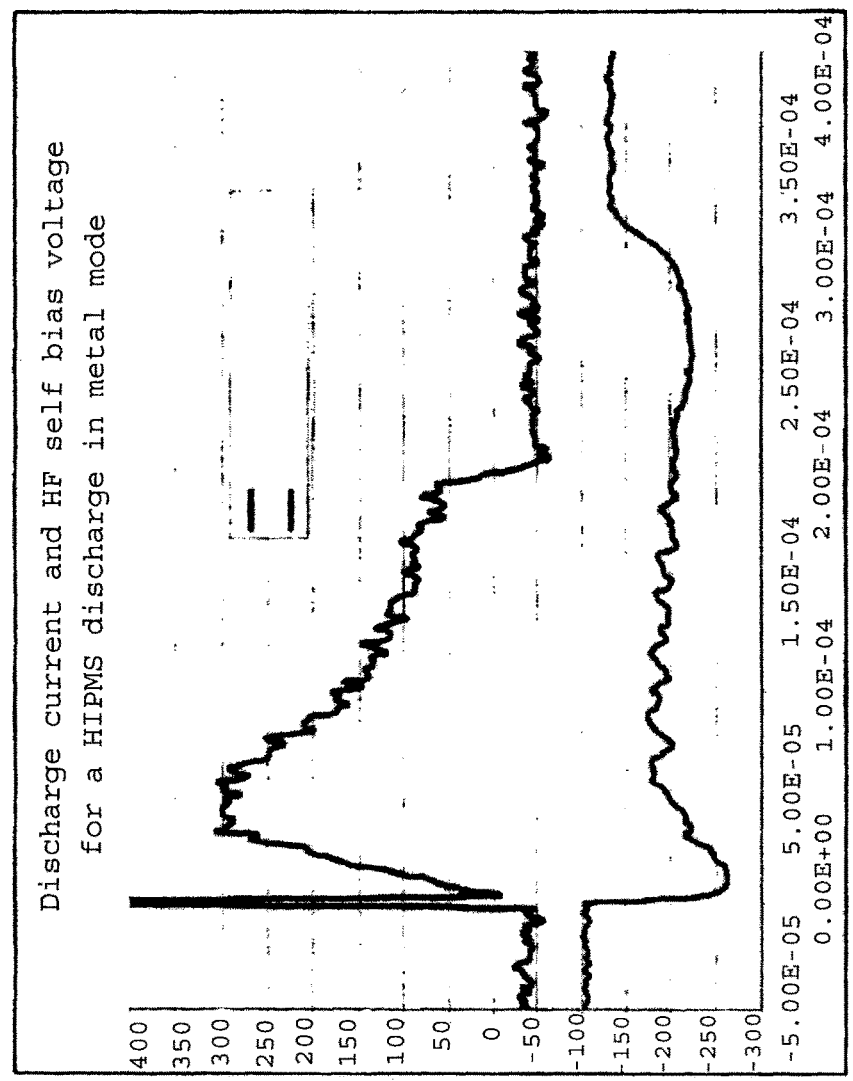
FIG. 13 is a plot of current and high-frequency voltage traces with an improved impedance matching accomplished using the impedance matching network shown in FIG. 12.

$Al_2O_3$ insulation layers were deposited into trenches prepared by deep silicon etch ("DSE") with aspect ratios of about 2.5:1 and about 10:1. FIG. 9 shows SEM cross sections of these coated trenches. The $Al_2O_3$ step coverage has been analyzed quantitatively from these cross sections in the locations as illustrated in FIG. 10, and the results summarized graphically in FIG. 11. It can be seen that in trenches with aspect ratio 10:1 a bottom coverage of about 15% can be achieved. Coverage in the edges of the trench is between 3 and 4%, but it has been found that these values can be improved by an optimized HF bias match work, being able to reduce the voltage decline as measured and reproduced in FIG. 8. An example of such an optimized HF bias match work is sketched in FIG. 12, and includes two tunable vacuum capacitors together with a coil of 0.6 μH. The results appear graphically as oscilloscope traces in FIG. 13, which show that the HF bias voltage stays around 180 V for HIPIMS currents up to about 300 A.

Illustrative embodiments have been described, hereinabove. It will be apparent to those skilled in the art that the above devices and methods may incorporate changes and modifications without departing from the general scope of this invention. It is intended to include all such modifications and alterations within the scope of the present invention. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method of High Power Impulse Magnetron Sputtering ("HIPIMS") sputter depositing an insulation layer on a substrate or of manufacturing a substrate with an insulating layer thereon, the method comprising:

providing a target formed at least in part from a material to be included in the insulation layer and the substrate in a substantially enclosed chamber defined by a housing;

igniting a plasma within the substantially enclosed chamber;

providing a magnetic field adjacent to a surface of the target to at least partially contain the plasma adjacent to the surface of the target;

increasing a voltage to repeatedly establish high-power electric pulses between a cathode and an anode, wherein an average power of the electric pulses is at least 0.1 kW;

controlling an operational parameter to promote the sputter depositing of the insulation layer substantially in a transition mode between a metallic mode and a reactive mode; and reacting the material from the target with a reactive gas within the substantially enclosed chamber to form an insulating material and depositing the insulating material onto the surface of the substrate, wherein controlling the operational parameter to promote the sputter depositing of the insulation layer substantially in the transition mode comprises:

maintaining the high-power electric pulses at a constant voltage value and maintaining a constant flow rate of the reactive gas into the substantially enclosed chamber;

recording an average discharge current of the high-power electric pulses; and adjusting a power per pulse by adjusting a duration of the high-power electric pulses in dependency of said average discharge current recorded.

2. The method of claim 1 further comprising depositing a dielectric layer onto the surface of the substrate before sputter depositing the insulating material onto the surface of the substrate, wherein the dielectric layer separates the insulation layer from the surface of the substrate.

3. The method of claim 1, further comprising minimizing said average discharge current by said adjusting.

4. The method of claim 1 further comprising applying a high-frequency signal to a support for supporting the substrate within the substantially enclosed chamber to generate a self-bias field adjacent to said substrate.

5. The method of claim 4 further comprising matching an impedance of a load supplied with the high-frequency signal generated by a variable power source to sustain an increasing voltage as an impedance of the insulation layer increases.

6. The method of claim 5, wherein an impedance matching network establishes a maximum self-bias voltage approximately simultaneously with a maximum discharge current delivered by the power supply establishing the high-power electric pulses.

7. The method of claim 1, wherein the material of the target to be included in the insulation layer is selected from the group consisting of silicon and aluminum.

8. The method of claim 1, wherein a specific deposition rate of the insulation layer deposited in the transition mode is at least 2.5 Å/kWs.

9. The method of claim 1, wherein a specific deposition rate of the insulation layer deposited in the transition mode is within a range from about 2.5 Å/kWs to about 4.2 Å/kWs.

10. The method of claim 1, wherein the material of the target to be included in the insulation layer comprises aluminum.

11. The method of claim 1, said substrate having at least one of a trench, a column, and a via.

12. A method of High Power Impulse Magnetron Sputtering ("HIPIMS") sputter depositing an insulation layer onto a substrate, the method comprising:

providing a target formed at least in part from a material to be included in the insulation layer;
generating a plasma;
rotating a magnet array with respect to the target;

increasing a voltage to repeatedly establish high-power electric pulses of constant voltage between a cathode and an anode, wherein an average power of the electric pulses is at least 0.1 kW;

recording an average discharge current of the high power electric pulses; and adjusting a power per pulse by adjusting a duration of the high power electric pulses based on the average discharge current recorded, and reacting the material from the target with a reactive gas to form an insulating material and depositing the insulating material onto the substrate, to thereby perform sputter depositing of the insulation layer substantially in a transition mode between a metallic mode and a reactive mode.

13. The method of claim 12, wherein the step of adjusting the duration of the high power electric pulses based on the average discharge current recorded includes decreasing said duration of the high power electric pulses such that the average discharge current decreases to a local minimum level of the average discharge current.

14. A method of High Power Impulse Magnetron Sputtering ("HIPIMS") sputter depositing an insulation layer onto a surface of a cavity formed in a substrate and having an aspect ratio, the method comprising:

providing a target formed at least in part from a material to be included in the insulation layer and the substrate in a substantially enclosed chamber defined by a housing;

igniting a plasma within the substantially enclosed chamber;

providing a magnetic field adjacent to a surface of the target to at least partially contain the plasma adjacent to the surface of the target;

increasing a voltage to repeatedly establish high-power electric pulses between a cathode and an anode, wherein an average power of the electric pulses is at least 0.1 kW;

controlling an operational parameter to promote the sputter depositing of the insulation layer substantially in a transition mode between a metallic mode and a reactive mode; and reacting the material from the target with a reactive gas within the substantially enclosed chamber to form an insulating material and depositing the insulating material onto the surface of the cavity, wherein controlling the operational parameter to promote the sputter depositing of the insulation layer substantially in the transition mode comprises: while recording an average discharge current of the high power electric pulses, adjusting a duty cycle of the electric pulses by adjusting at least one of duration and frequency of the electric pulses, and, based on said average discharge current of the electric pulses, selecting the duty cycle that substantially minimizes the average discharge current of the electric pulses, and maintaining the average discharge current at substantially a local minimum level between respective higher current levels associated with the reactive mode at shorter pulse durations and the metallic mode at longer pulse durations.

15. The method of claim 1, wherein adjusting the duration of the high power electric pulses includes adjusting the frequency of the pulses or the duty-cycle of the pulses.

16. The method of claim 12, wherein adjusting the duration of the high power electric pulses includes adjusting the frequency of the pulses or the duty-cycle of the pulses.

17. The method of claim 1, wherein adjusting the duration of the high-power electric pulses in dependency of said average discharge current recorded comprises adjusting the duration of each of the high-power electric pulses in dependency of said average discharge current recorded.

18. The method of claim 12, wherein adjusting the duration of the high-power electric pulses in dependency of said average discharge current recorded comprises adjusting the duration of each of the high-power electric pulses in dependency of said average discharge current recorded.

\* \* \* \* \*